(12) United States Patent
Naderi Alizadeh et al.

(10) Patent No.: US 9,853,654 B2
(45) Date of Patent: Dec. 26, 2017

(54) ERROR-FEEDBACK DIGITAL-TO-ANALOG CONVERTER (DAC)

(71) Applicant: QUALCOMM, Incorporated, San Diego, CA (US)

(72) Inventors: Mohammadhossein Naderi Alizadeh, College Station, TX (US); Shahin Mehdizad Taleie, San Diego, CA (US); Dongwon Seo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/631,578

(22) Filed: Feb. 25, 2015

(65) Prior Publication Data

US 2016/0248432 A1 Aug. 25, 2016

(51) Int. Cl.
| | |
|---|---|
| *H03M 1/68* | (2006.01) |
| *H03M 3/00* | (2006.01) |
| *H03M 7/30* | (2006.01) |
| *H03M 1/06* | (2006.01) |
| *H03M 1/00* | (2006.01) |

(52) U.S. Cl.
CPC ......... *H03M 1/0626* (2013.01); *H03M 1/002* (2013.01); *H03M 1/687* (2013.01); *H03M 3/368* (2013.01); *H03M 3/502* (2013.01); *H03M 7/3042* (2013.01)

(58) Field of Classification Search
CPC ..... H03M 3/436; H03M 7/3042; H03M 3/346
USPC ................................. 341/143, 145
See application file for complete search history.

(56) References Cited

U.S. PATENT DOCUMENTS

| | | | | |
|---|---|---|---|---|
| 4,868,572 | A * | 9/1989 | Reiber | H03M 7/3042 341/145 |
| 5,935,466 | A | 8/1999 | Knudsen | |
| 6,583,744 | B2 * | 6/2003 | Bright | H03M 1/0604 341/118 |
| 6,888,484 | B2 * | 5/2005 | Kiss | H03M 7/3042 341/143 |

(Continued)

FOREIGN PATENT DOCUMENTS

| | | | |
|---|---|---|---|
| DE | 102009024284 A1 * | 12/2010 | .......... H03M 7/3006 |
| GB | 2507099 A * | 4/2014 | ............ H03M 3/344 |

OTHER PUBLICATIONS

Ameur, N.B., et al., "Design of efficient digital interpolation filters and sigma-delta modulator for audio DAC," 3rd International Conference on Design and Technology of Integrated Systems in Nanoscale Era, 2008. DTIS 2008, Mar. 27, 2008, pp. 1-7.

(Continued)

*Primary Examiner* — Howard Williams
(74) *Attorney, Agent, or Firm* — Loza & Loza, LLP/Qualcomm (57) ABSTRACT

In one embodiment, a method for converting an input digital signal into an analog signal is provided. The method comprises modulating the input digital signal into a modulated digital signal, and converting the modulated digital signal into the analog signal using a digital-to-analog converter (DAC). The modulation shapes quantization noise of the DAC to place a notch at a frequency within an out-of-bound frequency band to reduce the quantization noise within the out-of-bound frequency band.

31 Claims, 10 Drawing Sheets

(56) References Cited

U.S. PATENT DOCUMENTS

| | | | |
|---|---|---|---|
| 7,026,967 B2* | 4/2006 | Eloranta | H03M 1/0651 341/120 |
| 7,528,754 B1 | 5/2009 | Bakkaloglu et al. | |
| 8,306,096 B2* | 11/2012 | Sampath | H04B 1/005 341/144 |
| 8,325,074 B2 | 12/2012 | Kinyua | |
| 8,633,842 B2* | 1/2014 | Azadet | H03M 7/3042 341/118 |
| 9,166,617 B1* | 10/2015 | Beaulaton | H03M 3/404 |
| 2002/0193090 A1* | 12/2002 | Sugar | H04B 1/1615 455/343.1 |
| 2005/0265481 A1 | 12/2005 | Bellaouar et al. | |
| 2012/0188107 A1 | 7/2012 | Ashburn, Jr. et al. | |
| 2013/0271305 A1 | 10/2013 | Kim et al. | |
| 2015/0003502 A1* | 1/2015 | Menkhoff | H03B 3/438 375/219 |

OTHER PUBLICATIONS

Magrath, A.J., et al., "Performance enhancement of sigma-delta modulator D-A converters using non-linear techniques," IEEE International Symposium on Circuits and Systems, 1996. ISCAS '96., Connecting the World, 1996, May 12-15, 1996, pp. 277-280, vol. 2.

Shibata, M., et al., "A cascaded delta-sigma DAC with an analog FIR filter reducing mismatch-effects," 48th Midwest Symposium on Circuits and Systems, 2005, Aug. 7-10, 2005, pp. 1263-1266, vol. 2.

Shui, T., et al., "Mismatch shaping for a current-mode multibit delta-sigma DAC," IEEE Journal of Solid-State Circuits, Mar. 1999, pp. 331-338, vol. 34, No. 3.

Wang, Y., et al., "16-bit Delta-Sigma DAC with cascade-of-resonators feed-forward modulator and interpolation filter with OCSD code," International Conference on optoelectronics and Microelectronics (ICOM), 2012, Aug. 23-25, 2012, pp. 478-481.

Kiss P., et al., "Stable High-Order Delta-Sigma Digital-to-Analog Converters," IEEE Transactions on Circuits and Systems I: Regular Papers, Apr. 2004, vol. 51 (1), pp. 200-205.

International Search Report and Written Opinion—PCT/US2016/015193—ISA/EPO—May 11, 2016.

Kiss P., et al., "Stable High-Order Delta-Sigma DACS," Proceedings of the International Symposium on Circuits and Systems (ISCAS), May 25, 2003, vol. 1, pp. 1-985, XP002362554, ISBN: 978-0-7803-7761-5, figure 1d.

* cited by examiner

ERROR-FEEDBACK DIGITAL-TO-ANALOG CONVERTER (DAC)

BACKGROUND

Field

Aspects of the present disclosure relate generally to digital-to-analog converters (DACs), and more particularly, to an error-feedback DAC.

Background

A digital-to-analog converter (DAC) converts a digital signal into an analog signal. A DAC may be used in a transmitter to convert a digital signal (e.g., digital signal modulated with data) into an analog signal. The analog signal may then be processed by analog circuitry (e.g., low-pass filter, frequency up converter, and/or power amplifier) and transmitted wirelessly via one or more antennas.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a circuit is provided herein. The circuit comprises an error-feedback modulator configured to receive an input digital signal, and to modulate the digital input signal into a modulated digital signal. The circuit also comprises a digital-to-analog converter (DAC) configured to convert the modulated digital signal into an analog signal. The error-feedback modulator is configured to modulate the input digital signal to shape quantization noise of the DAC to place a notch at a frequency within an out-of-bound frequency band to reduce the quantization noise within the out-of-bound frequency band.

A second aspect relates to a method for converting an input digital signal into an analog signal. The method comprises modulating the input digital signal into a modulated digital signal, and converting the modulated digital signal into the analog signal using a digital-to-analog converter (DAC). The modulation shapes quantization noise of the DAC to place a notch at a frequency within an out-of-bound frequency band to reduce the quantization noise within the out-of-bound frequency band.

A third aspect relates to an apparatus for converting an input digital signal into an analog signal. The apparatus comprises means for modulating the input digital signal into a modulated digital signal, and means for converting the digital signal into the analog signal using a digital-to-analog converter (DAC). The means for modulating shapes quantization noise of the DAC to place a notch at a frequency within an out-of-bound frequency band to reduce the quantization noise within the out-of-bound frequency band.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
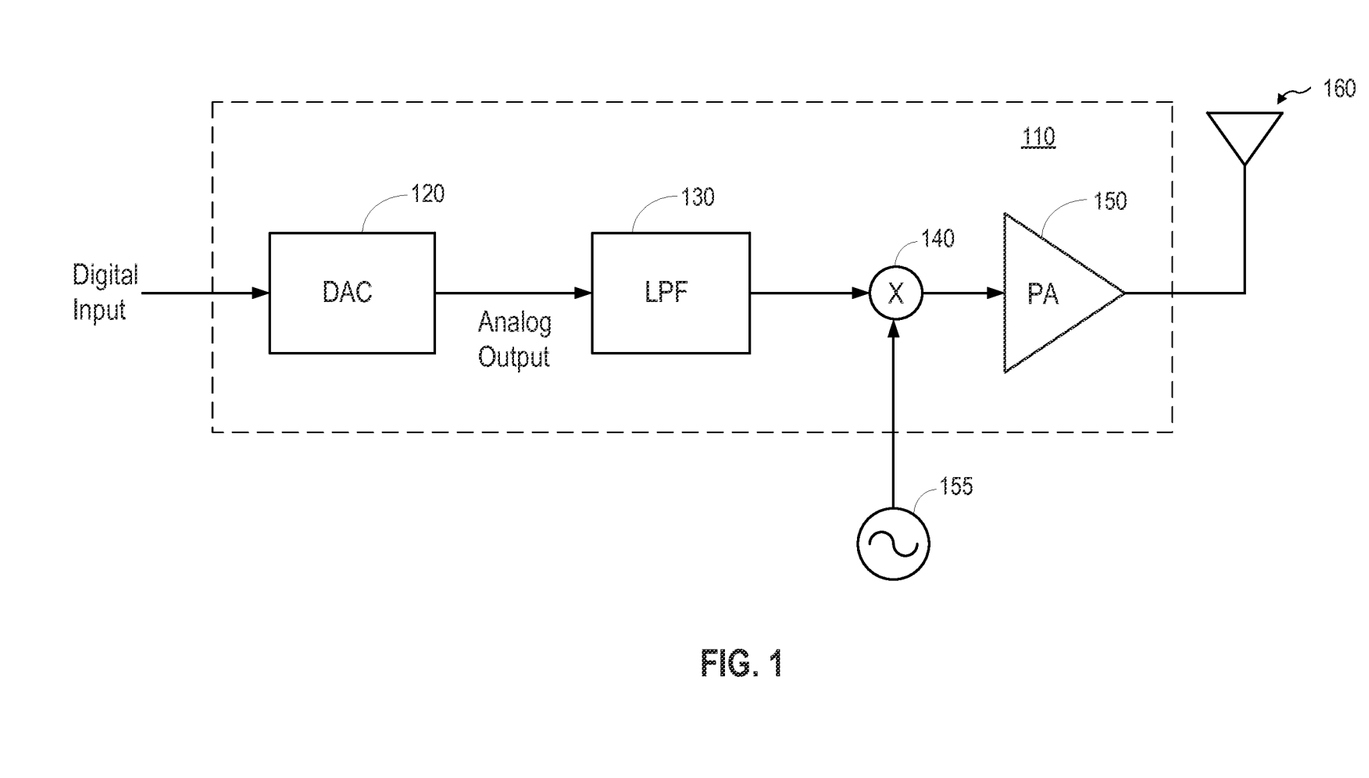
FIG. 1 shows an example of a transmitter.

Digital-to-analog converters (DACs) are commonly used in transmitters to convert a digital signal into an analog signal for wireless transmission. In this regard, FIG. 1 is a block diagram showing an example of a transmitter 110. The transmitter 110 may be located in a mobile device (e.g., cellular phone, laptop, tablet, etc.) for providing the device with wireless communication capability in a Long Term Evolution (LTE) system, a Code Divisional Multiple Access (CDMA) system, and/or other type of communication system. The transmitter 110 may comprise a DAC 120, a low-pass filter (LPF) 130, a mixer 140, and a power amplifier (PA) 150.

In operation, the DAC 120 converts a digital signal (e.g., baseband digital signal) into an analog signal. For example, the digital signal may comprise a digital signal modulated with data. The analog output of the DAC 120 is low-passed filtered by the LPF 130 to reduce out-of-band noise and DAC images, as discussed further below. The mixer 140 mixes the output signal of the LPF 130 with an oscillator signal from an oscillator 155 to frequency up-convert the signal. For example, the oscillator signal may have a frequency approximately equal to a carrier frequency at which the signal is to be transmitted. The up-converted signal is then amplified by the PA 150, and the amplified signal is transmitted wirelessly via an antenna 160. For the example in which the transmitter is located on a mobile device, the signal may be transmitted to a base station and/or another device. It is to be appreciated that FIG. 1 shows a simplified diagram of the transmitter 110 for ease of discussion, and that the transmitter 110 may include additional components, such as in-phase (I) and quadrature (Q) paths for quadrature modulation.

In a conventional transmitter, a high-order LPF (an LPF with sharp frequency roll off) is used to reduce out-of-band noise (noise outside the frequency band of signals to be transmitted). For example, the high-order LPF may be a seventh-order LPF. A drawback of this approach is that the high-order LPF reduces the bandwidth of the transmitter. The bandwidth of the transmitter may be increased by using a low-order LPF (e.g., second-order LPF). This is because the low-order LPF has a slower frequency roll off than a high-order LPF. The larger bandwidth allows higher data transmission rates (e.g., faster LTE modes for an LTE implementation) and/or allows digital pre-distortion (DPD) operations to be performed, which allow the use of a low-cost non-linear power amplifier. The low-order LPF also takes up less area (e.g., silicon area) than the high-order filter.

Figure 2:
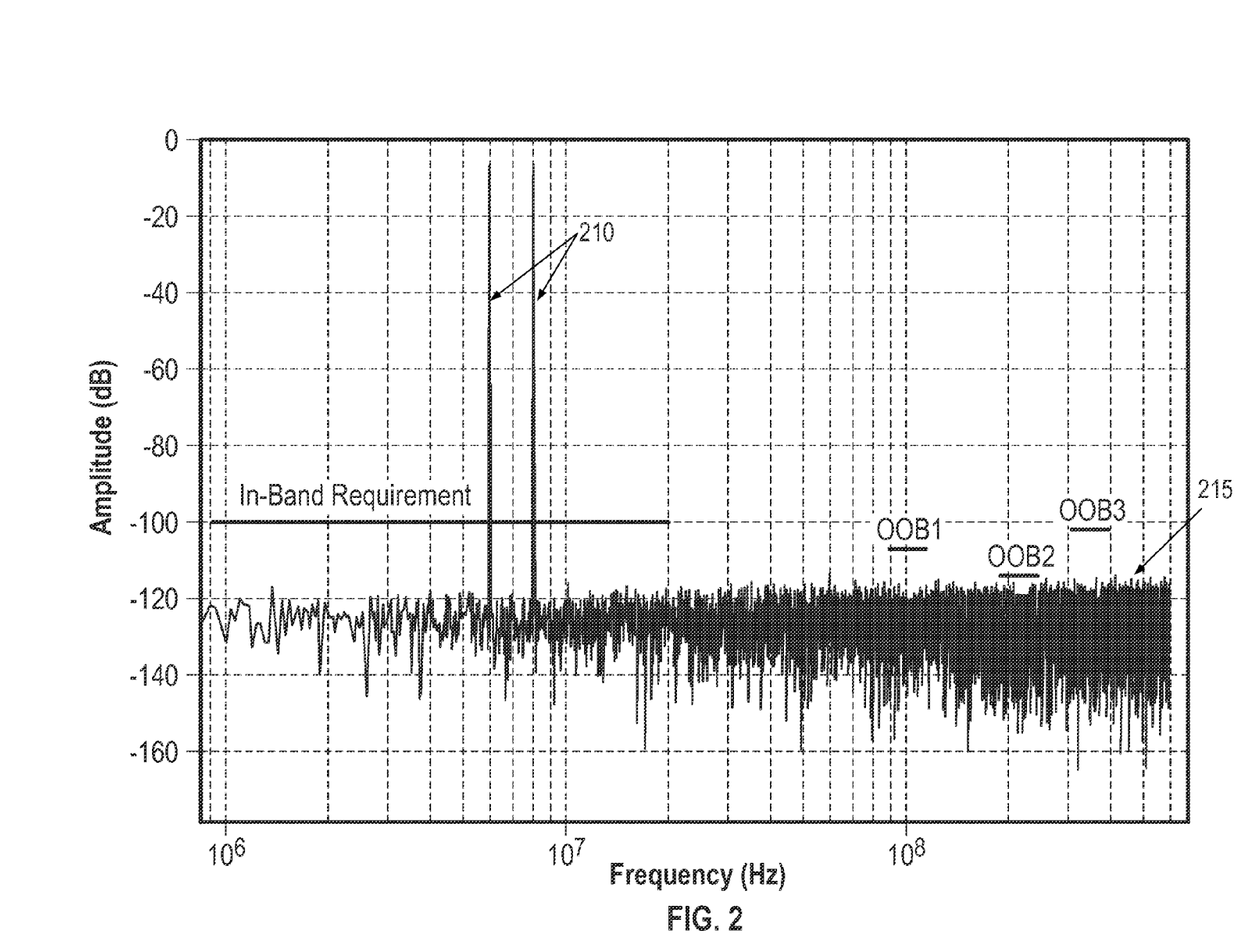
FIG. 2 shows an example of a frequency spectrum for a conventional DAC.

However, a low-order LPF is less effective at attenuating out-of-band noise than a high-order LPF because of the slower frequency roll off. As a result, the low-order LPF may require that the output of the DAC have lower out-of-band noise in order to satisfy certain out-of-band noise requirements. In this regard, FIG. 2 shows an example of a frequency spectrum for the output of a conventional DAC, in which the x-axis is frequency and the y-axis is the amplitude of the output of the DAC. In this example, desired signals 210 are located at two frequencies (tones) within the in-band (e.g., frequency band of signals to be transmitted). The rest of the DAC output is noise (e.g., quantization noise). FIG. 2 also shows an in-band noise requirement that the DAC needs to satisfy in order to achieve a desired signal-to-noise ratio (SNR). In the example in FIG. 2, the in-band noise requirement is about −100 dB (i.e., noise not to exceed −100 dB within the in-band). For an LTE implementation, the in-band may span from 5 MHz to 40 MHz, and for a CDMA implementation, the in-band may span approximately 5 MHz.

FIG. 2 also shows out-of-band noise requirements that the output of the DAC needs to satisfy when a low-order LPF is used (e.g., when the LPF 130 in FIG. 1 is a low-order LPF). More particularly, FIG. 2 shows an example of three out-of-band frequency bands (labeled "OOB1", "OOB2" and "OOB3") and the noise requirement for each of the out-of-band frequency bands when a second-order LPF is used. The noise requirement for each out-of-band frequency band specifies an amplitude that the noise should not exceed within the out-of-band frequency band. In this example, OOB2 has the toughest noise requirement with a noise requirement close to −120 dB.

One of the out-of-band noise requirements may come from the receive band noise (RxBN) requirement for a receiver. For example, a receiver may receive signals within a receive frequency band corresponding to one of the out-of-band frequency bands of the transmitter. As a result, noise within the corresponding out-of-band frequency band of the transmitter may add noise within the receive band of the receiver, decreasing the sensitivity of the receiver. In this example, the noise within the receive band may need to be below a certain level in order for the receiver to achieve a desired sensitivity. As a result, the noise within the corresponding out-of-band frequency band may need to be below a certain level in order for the RxBN requirement of the receiver to be satisfied. In this example, the receiver may be a receiver located in the same device (e.g., mobile device) as the transmitter 110 and/or a receiver located in a neighboring device. A more detailed discussion of the out-of-band noise requirements is given below.

As shown in FIG. 2, the conventional DAC has a relatively uniform noise floor 215 across the frequency spectrum. The amplitude of the noise floor 215 depends on the number of quantization bits of the DAC. The higher the number of quantization bits, the lower the noise floor 215. FIG. 2 shows an example in which the DAC has 14 quantization bits, although it is to be appreciated that a different number of quantization bits may be used. A problem with this approach is that the DAC requires a relatively large number of quantization bits in order for the noise floor 215 to satisfy the toughest out-of-band noise requirement (noise requirement for OOB2 in this example). In other words, the noise floor 215 across the frequency spectrum must be as low as the toughest noise requirement. As a result, the DAC is overdesigned for other bands that have less stringent noise requirements. This increases the size and power consumption of the DAC.

Figure 3:
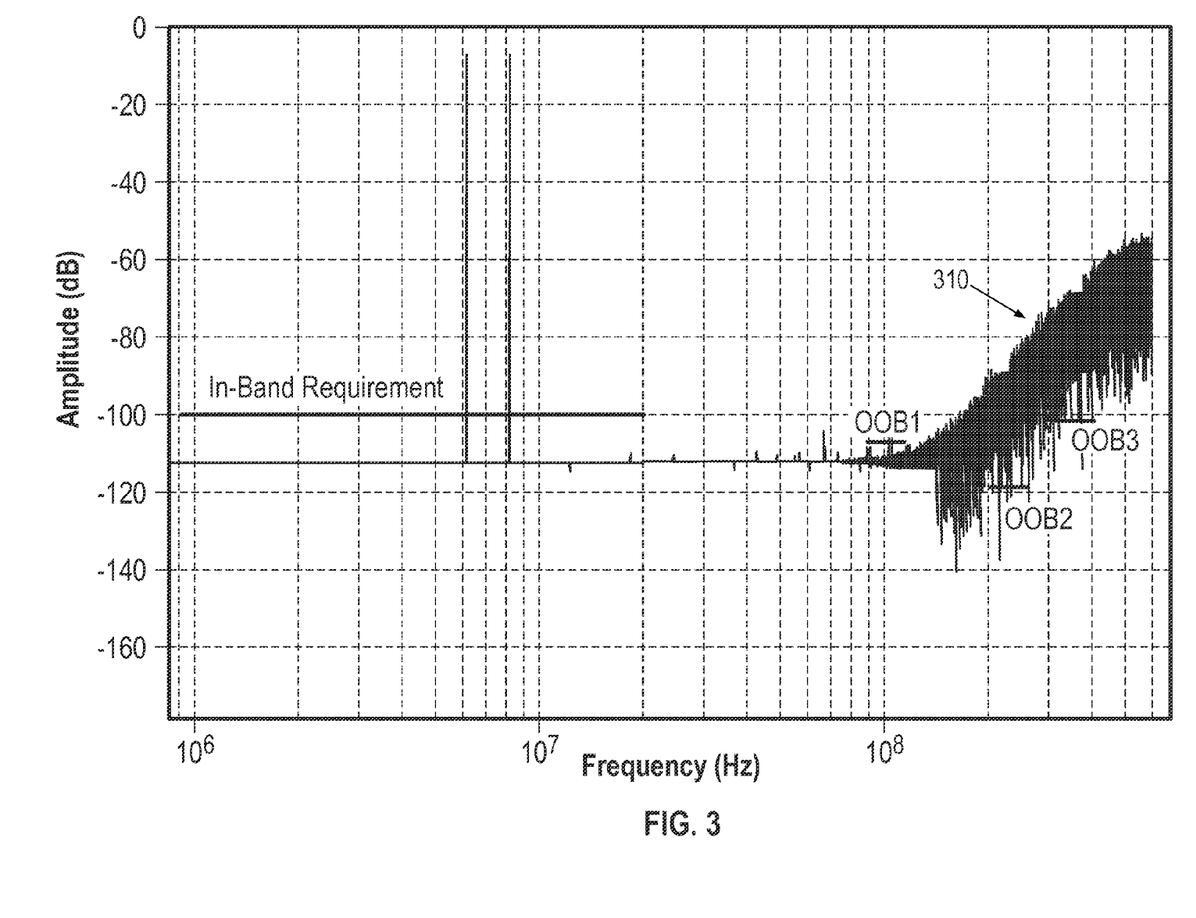
FIG. 3 shows an example of a frequency spectrum for a delta-sigma DAC.

One approach to reduce the number of quantization bits of the DAC is to use a delta-sigma DAC. A delta-sigma DAC reduces the in-band noise with fewer quantization bits by pushing the noise to out-of-band frequencies. In this regard, FIG. 3 shows an example of the frequency spectrum of a 9-bit delta-sigma DAC in which the noise 310 at the output of the DAC is pushed to out-of-band frequencies. As a result, the delta-sigma DAC is able to achieve low in-band noise with fewer quantization bits, thereby reducing area and power consumption. As shown in FIG. 3, the delta-sigma DAC is able to satisfy the in-band noise requirement of the transmitter with fewer quantization bits (e.g., 9 quantization bits versus 14 quantization bits for the prior DAC shown in FIG. 2). However, by pushing the noise 310 to out-of-band frequencies, the noise requirements for OOB2 and OOB3 are no longer satisfied using a second-order LPF (i.e., the noise within OOB2 and OOB3 exceeds the noise requirements for OOB2 and OOB3). This is illustrated in FIG. 3, which shows the noise requirements for OOB1, OOB2 and OOB3 when a second-order LPF is used. As a result, a second-order LPF cannot be used with this approach, and a higher-order LPF is required to filter out the noise pushed to the out-of-band frequencies. The higher-order LPF reduces the bandwidth of the transmitter, as discussed above.

Embodiments of the present disclosure provide an error-feedback DAC that is able to satisfy both in-band and out-of-band noise requirements with fewer quantization bits than conventional DACs. This is achieved by modulating the digital input with an error-feedback modulator that shapes the quantization noise of the DAC with notches placed at frequencies within the out-of-band frequency bands of interest (e.g., OOB1, OOB2 and OOB3). The notches reduce out-of-band noise within the out-of-band frequency bands (e.g., OOB1, OOB2 and OOB3) to satisfy out-of-band noise requirements, as discussed further below.

Figure 4:
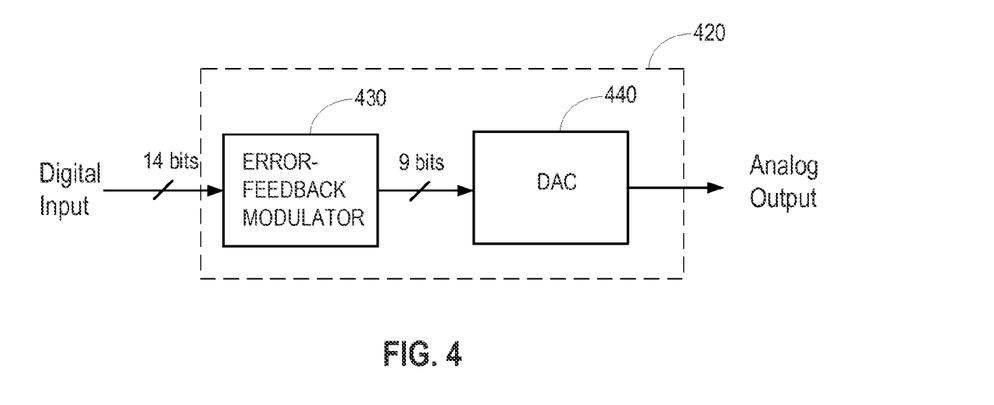
FIG. 4 shows an error feedback DAC according to an embodiment of the present disclosure.

FIG. 4 shows an error-feedback DAC 420 according to an embodiment of the present disclosure. The error-feedback DAC 420 may be used to implement the DAC 120 shown in FIG. 1. The error-feedback DAC 420 comprises an error-feedback delta-sigma modulator 430 and a DAC 440. The error-feedback modulator 430 is configured to receive a digital input signal, modulate the input signal to shape the quantization noise of the DAC 440, and output the modulated signal to the DAC 440. In the example in FIG. 4, the modulator 430 receives a 14-bit digital signal (e.g., 14 bits per data sample) and outputs a 9-bit digital signal to the DAC 440. The DAC 440 converts the 9-bit output of the modulator 430 into an analog signal, as discussed further below. Thus, the error-feedback DAC 420 has 9 quantization bits (i.e., the DAC 440 converts nine bits into an analog signal), which is less than the number of bits (i.e., 14 bits) input to the modulator 430.

Figure 5:
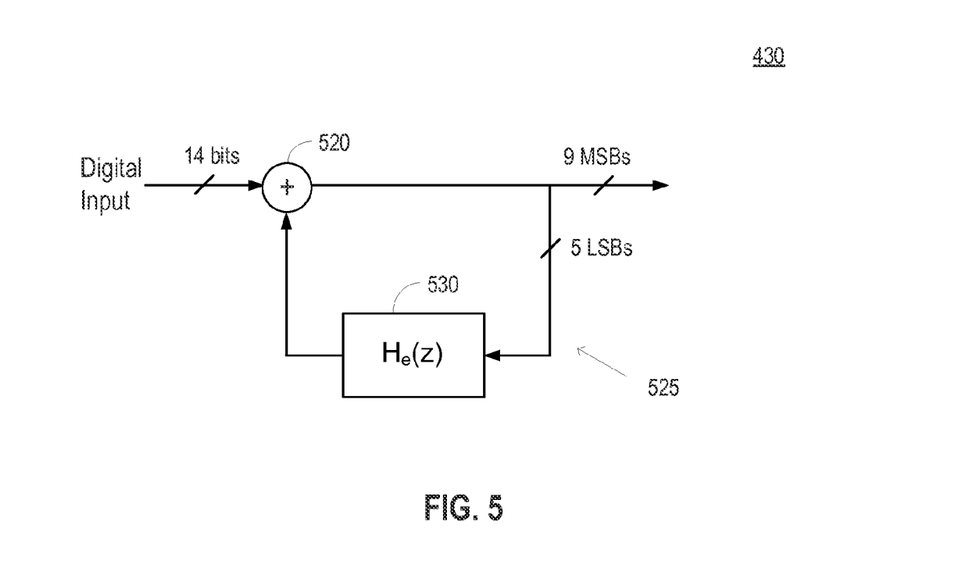
FIG. 5 shows an exemplary implementation of an error-feedback modulator according to an embodiment of the present disclosure.

FIG. 5 shows an exemplary implementation of the error-feedback modulator 430 according to an embodiment of the present disclosure. The modulator 430 comprises an adder 520 and a digital feedback filter 530. In operation, the adder 520 receives the digital input signal (e.g., 14-bit input signal) and adds the output of the digital feedback filter 530 to the input signal. In the example in FIG. 5, the 9 most significant bits (MSBs) of the adder output are provided to the DAC 440 as the output of the modulator 430, and the 5 least significant bits (LBSs) of the adder output are fed back to the digital feedback filter 530 in a feedback loop 525. The 5 LBSs fed back to the digital feedback filter 530 may be referred to as error bits. The digital feedback filter 530 may have a filter function given by:

$$H_e(z)=\alpha_1 \cdot z^{-1}+\alpha_2 \cdot z^{-2}+\alpha_3 \cdot z^{-3}+\alpha_4 \cdot z^{-4}+\alpha_5 \cdot z^{-5} \quad (1)$$

where $\alpha_1$ to $\alpha_5$ are filter coefficients, and $z^{-1}$ represents a delay of one sample period in the Z domain. A filter coefficient may be a positive value or a negative value. For example, a filter coefficient may be a positive integer or a negative integer to simplify implementation of the feedback filter 530 compared with using a fractional value for the coefficient.

As discussed above, the modulator 430 shapes the quantization noise of the DAC 440 with notches to reduce out-of-bound noise within the out-of-bound frequency bands of interest (e.g., OOB1, OOB2 and OOB2). The locations of the notches on the frequency axis may be adjusted by adjusting the values of the filter coefficients (e.g., coefficients $\alpha_1$ to $\alpha_5$) of the digital feedback filter 530. Thus, the values of the filter coefficients may be adjusted to place a notch within each of the out-of-band frequency bands to reduce out-of-band noise within each of the out-of-band frequency bands (e.g., OOB1, OOB2 and OOB3). The locations of the notches may also be adjusted by adjusting the sampling frequency of the digital input signal (i.e., rate at which digital values arrive at the input of the modulator 430).

Figure 6:
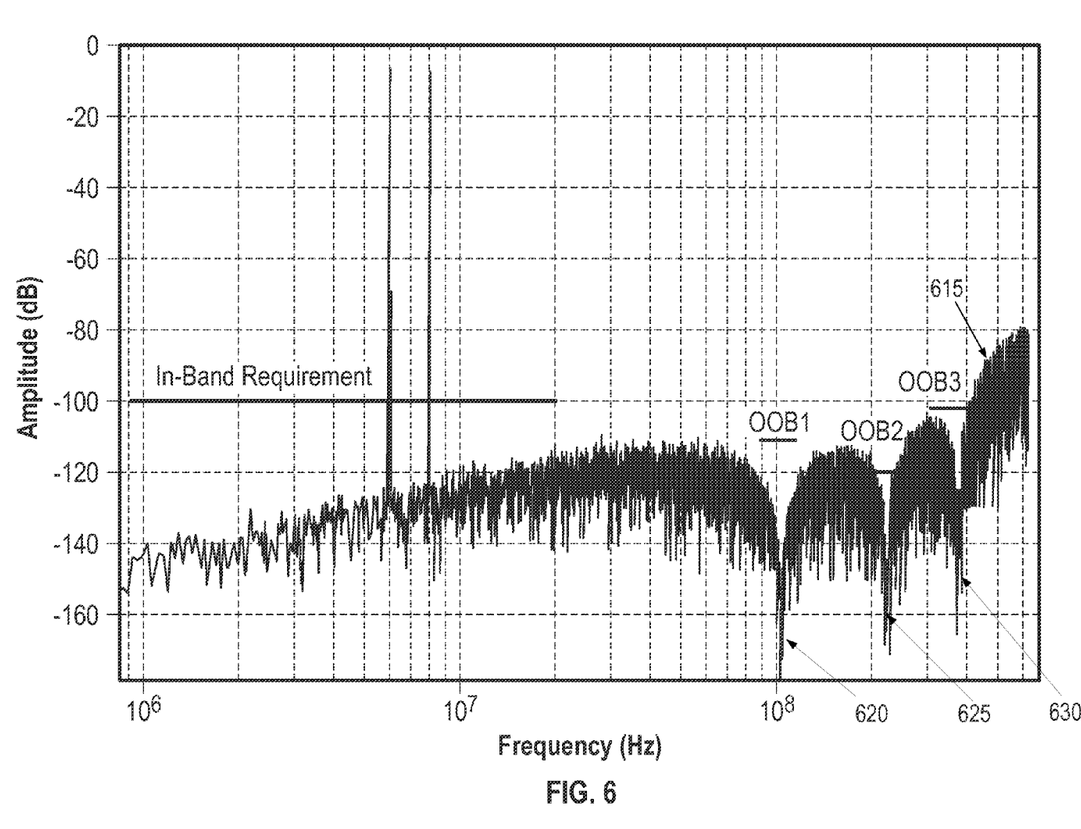
FIG. 6 shows an example of a frequency spectrum for the DAC in FIG. 4 according to an embodiment of the present disclosure.

In this regard, FIG. 6 shows an exemplary frequency spectrum for the error-feedback DAC 420, in which the exemplary out-of-band noise requirements for OOB1, OOB2 and OOB3 are used to illustrate noise shaping by the modulator 430. The out-of-band noise requirements are for a second-order LPF. In this example, the modulator 430 shapes the noise 615 of the error-feedback DAC 420 with notches 620, 625 and 630. The values of the filter coefficients and/or sampling frequency are adjusted so that each notch 620, 625 and 630 is placed within a respective one of the out-of-band frequency bands OOB1, OOB2 and OOB3, as shown in FIG. 6. Each notch 620, 625 and 630 reduces the noise within the respective out-of-band frequency band to satisfy the noise requirement for that band. The notches 620, 625 and 630 push the noise 615 to non-critical bands (i.e., bands outside of OOB1, OOB2 and OOB3). As shown in FIG. 6, the in-band noise requirement is also satisfied.

Thus, in this example, the error-feedback DAC 420 is able to satisfy the in-band noise requirement and the out-of-band noise requirements for OOB1, OOB2 and OOB3 for a second-order LPF with 9 quantization bits. In contrast, the conventional delta-sigma DAC is not able to satisfy the out-of-band noise requirements for OOB2 and OOB3 for a second-order LPF, as shown in FIG. 3. Further, the error-feedback DAC 420 is able to satisfy the in-band and out-of-band noise requirements using fewer quantization bits than the conventional DAC with the uniform noise floor (e.g., 9 quantization bits versus 14 quantization bits). The lower number of quantization bits reduces the size and power consumption of the DAC 440.

In one aspect, the input digital signal may have a high sampling frequency (e.g., a sampling frequency above the Nyquist rate or oversampling). The high sampling frequency and the quantization bits being less than the input bits to the modulator allow the error-feedback DAC 420 to achieve the required in-band SNR with fewer current cells in the DAC 440.

Figure 7:
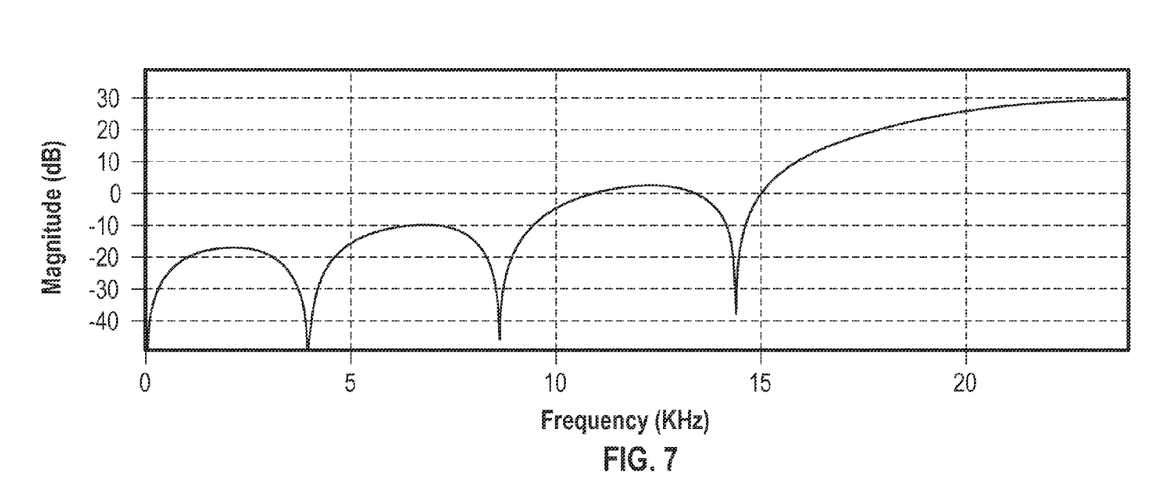
FIG. 7 shows an exemplary frequency response for a DAC according to an embodiment of the present disclosure.
Figure 8:
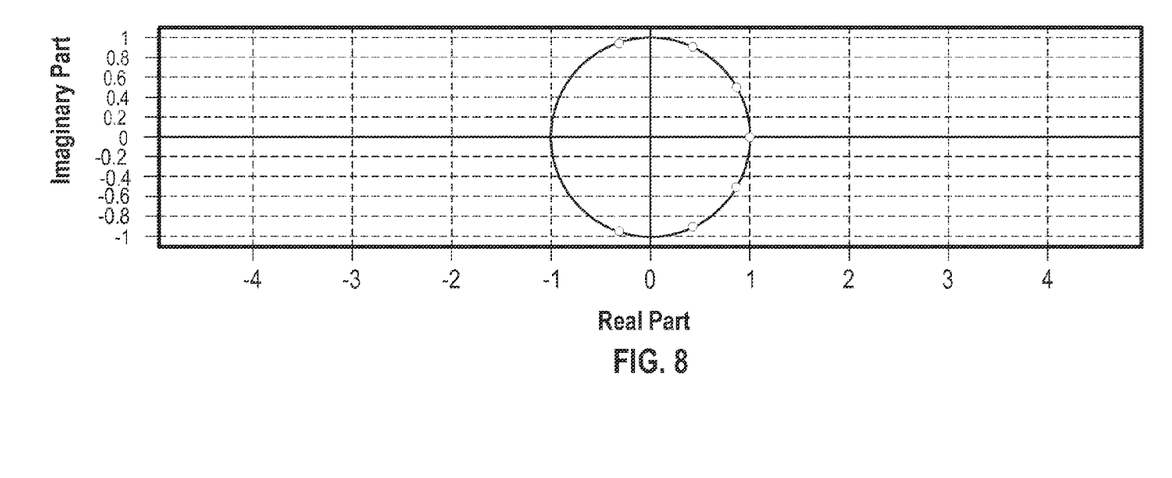
FIG. 8 is a plot showing an example of zero locations for a DAC according to an embodiment of the present disclosure.

FIG. 7 shows an example of a frequency response for the error-feedback DAC 420 according to an embodiment of the present disclosure. As shown in FIG. 7, the frequency response includes notches, which may be used to reduce quantization noise within specific out-of-band frequency bands to satisfy out-of-band noise requirements, as discussed above. FIG. 8 is a plot showing an example of zero locations for the error-feedback DAC 420, in which each zero is shown as an open circle. In this example, one zero is placed at DC to satisfy the in-band noise requirement, and other zeros are placed at specific out-of-band frequencies to satisfy output-of-band noise requirements. Each of the other zeros may correspond to a notch, which reduces noise at the respective frequency. The locations of the zeros (and hence notches) may be adjusted by adjusting the values of the filter coefficients of the feedback filter 530 and/or sampling frequency, as discussed above.

Although FIG. 5 shows an example in which the 9 MBSs of the adder output go to the output of the modulator 430 and the 5 LSBs of the adder output are fed back to the filter 530, it to be appreciated that the present disclosure is not limited to this example. In general, the M MSBs of the adder output may be output from the modulator 430 and the N LSBs of the adder output may be fed back to the filter 530, where M and N are integers. In this case, the filter 530 may have N filter coefficients.

Further, although embodiments of the present disclosure are described above using the example of a second-order LPF, it is to be appreciated that the present disclosure is not limited to this example. For example, embodiments of the present disclosure may be used with a first-order LPF, or a third-order LPF.

Figure 9:
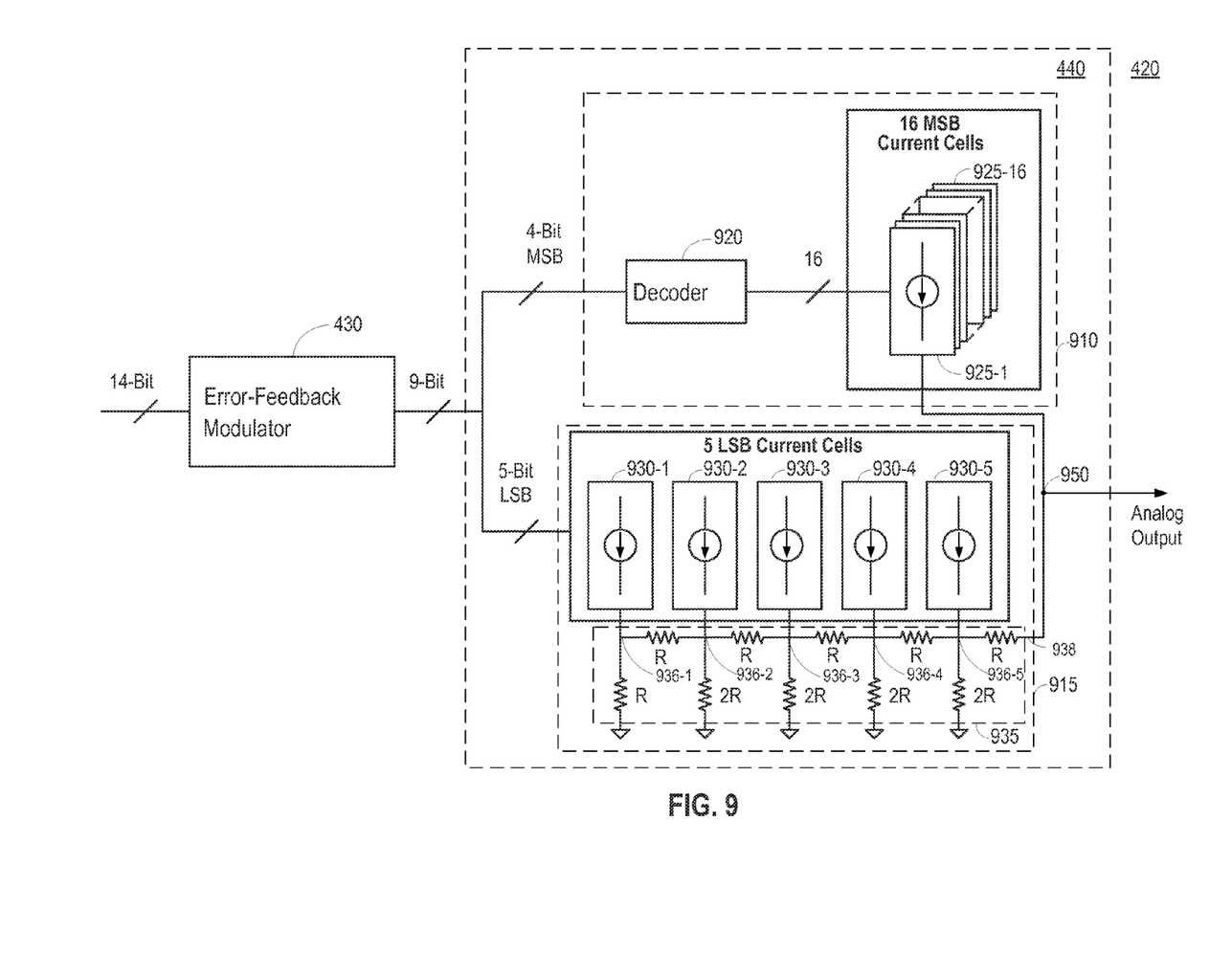
FIG. 9 shows an exemplary implementation of a DAC according to an embodiment of the present disclosure.

FIG. 9 shows an exemplary implementation of the DAC 440 according to an embodiment of the present disclosure. The DAC 440 comprises a first conversion circuit 910 and a second conversion circuit 915. In the example shown in FIG. 9, the 9-bit output of the modulator 430 is split so that the 4 most significant bits (MBSs) of the output are input to the first conversion circuit 910, and the 5 least significant bits (LBSs) of the output are input to the second conversion circuit 915. In this example, the first conversion circuit 910 is configured to convert the 4 MBSs of the modulator output into an analog signal, and the second conversion circuit 915 is configured to convert the 5 LSBs of the modulator output into an analog signal. The outputs of the first and second conversion circuits 910 and 915 are combined at node 950 to generate the analog output of DAC 440, as discussed further below.

The first conversion circuit 910 comprises a binary-to-thermometer decoder 920 and a plurality of current cells 925-1 to 925-16. Each current cell 925-1 to 925-16 may have the same amount of current, in which the amount of current of one current cell may be referred to as one unit of current. In the example in FIG. 9, the first conversion circuit 910 comprises 16 current cells 925-1 to 925-16.

In operation, the binary-to-thermometer decoder 920 decodes the 4 MSBs of the modulator output into one of 16 different current levels (i.e., $2^4$), in which each current level may correspond to a different multiple of a unit of current. The decoder 920 then enables a number of the current cells 925-1 to 925-16 according to the current level, in which each enabled current cell contributes one unit of current to the output of the first conversion circuit 910. For example, the decoder 920 may enable four of the current cells if the decoder 920 decodes the 4 MBSs into a current level equal to four units of current. In another example, the decoder 920 may enable ten of the current cells if the decoder 920 decodes the 4 MBSs into a current level equal to ten units of current. Thus, the binary-to-thermometer decoder 920 and the current cells 925-1 to 925-16 convert the 4 MBSs of the modulator output into a current, in which the current has one of 16 current levels depending on the binary values of the 4 MBSs.

Figure 10:
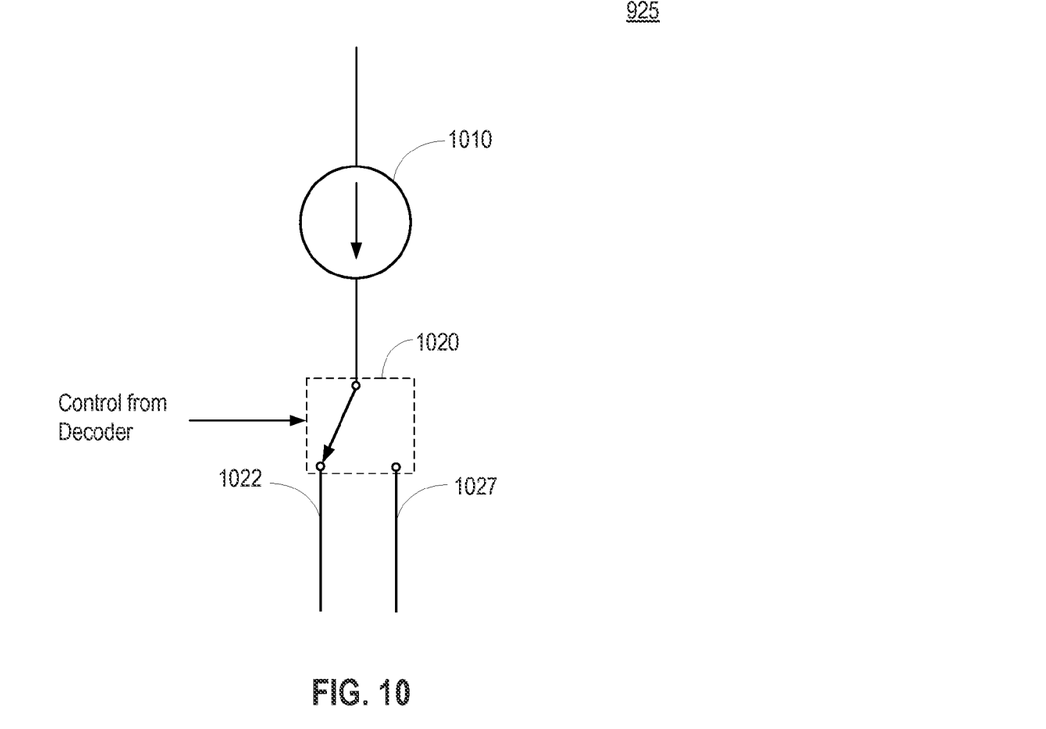
FIG. 10 shows an exemplary implementation of a current cell according to an embodiment of the present disclosure.

FIG. 10 shows an exemplary implementation of one of the current cells 925 according to an embodiment of the present disclosure. In this embodiment, the current cell 925 comprises a current source 1010 and a switch 1020 controlled by the binary-to-thermometer decoder 920. The current source 1010 may source one unit of current. The switch 1020 may be configured to selectively couple the current of the current source 1010 to current path 1022 or current path 1027 under the control of the decoder 920. The switch 1020 may be implemented using a differential switch or other type of switch.

In one embodiment, current path 1022 is coupled to the output of the first conversion circuit 910, and current path 1027 is not coupled to the output of the first conversion circuit 910. In operation, if the current cell 925 is enabled by the decoder 920, then the switch 1020 couples the current of the current source 1010 to current path 1022. In this case, the current of the current source 1010 contributes one unit of current to the total current output from the first conversion circuit 910. If the current cell 925 is disabled by the decoder 920, then the switch 1020 couples the current of the current source 1010 to current path 1027. In this case, the current of the current source 1010 does not contribute to the current output from the first conversion circuit 910. In other words, the switch 1020 steers the current of the current source 1010 to the output of the first conversion circuit via current path 1022 if the current cell 925 is enabled, and steers the current of the current source 1010 to current path 1027 if the current cell 925 is disabled. It is to be appreciated that each of the current cells shown in FIG. 9 may be implemented using the current cell shown in FIG. 10.

Referring back to FIG. 9, the second conversion circuit 915 comprises a plurality of current cells 930-1 to 930-5 and a segmented resistor circuit 935 comprising a network of resistors. In the example in FIG. 9, the resistors have resistances of R and 2R. Each of the current cells 930-1 to 930-5 may have one unit of current. Thus, in this example, each of the current cells 930-1 to 930-5 may have approximately the same amount of current as a current cell 925-1 to 925-16 in the first conversion circuit 910. This facilitates glitch noise matching between the MSBs and LSBs of the modulator output.

In one embodiment, each of the 5 LSBs of the modulator output corresponds to a respective one of the current cells 930-1 to 930-5. More particularly, the value of each of the LSBs controls whether the respective current cell is enabled. For example, if the value for one of the LSBs is one, then the respective current cell may be enabled, and if the value for one of the LSBs is zero, then the respective current cell may be disabled. When a current cell 930-1 to 930-5 is enabled, the current cell may output one unit of current to a respective node 936-1 to 936-5 on the segmented resistor circuit 915, as shown in FIG. 9. The output current of the second conversion circuit is taken at output node 938 of the segmented resistor circuit 915.

The segmented resistor circuit 935 passively splits the current of each current cell so that only a fraction of the current reaches the DAC output 950. For each current cell, a different fraction of the respective current reaches the DAC output 950. For example, current cell 930-1 has the smallest fraction of its current reaching the DAC output 950. This is because the current from current cell 930-1 is split by the largest number of stages of the segmented resistor circuit 935. Current cell 930-5 has the largest fraction of its current reaching the DAC output 950.

Thus, each of 5 LSBs contributes a different amount of current to the DAC output 950. The least significant one of the 5 LSBs controls current cell 930-1, which contributes the least amount of current to the DAC output 950. The most significant one of the 5 LSBs controls current cell 930-5, which contributes the most amount of current to the DAC output 950. In other words, the current for each bit of the 5 LBSs is weighted by the segmented resistor circuit 935 according to the significance of the bit, in which the least significant one of the LSBs is weighted the least and the most significant one of the LSBs is weighted the most. Thus, the current cells 930-1 to 930-5 and the segmented resistor circuit 935 convert the 5 LBSs of the modulator output into a current, in which the level of the current depends on the binary values of the 5 LBSs.

The current from the first conversion circuit 910 and the current from the second conversion circuit 915 are combined (summed) at the output 950 of the error-feedback DAC 420 to provide the analog output of the error-feedback DAC 420. Thus, in this embodiment, the error-feedback DAC 420 converts the input digital signal into an analog current. The current may be converted into an analog voltage by a load (not shown) coupled to the output 950 of the error-feedback DAC 420. The load may be a capacitive load or other type of load.

The first conversion circuit 910, which uses binary-to-thermometer decoding, converts bits of the modulator output into a current with higher precision than the second conversion circuit 915, which uses resistor segmentation (e.g., R-2R segmentation). However, the second conversion circuit 915 only uses one current cell per bit while the first conversion circuit 910 uses $2^n$ current cells where n is the number of bits input to the first conversion circuit 910. Thus, the second conversion circuit 915 uses fewer current cells and therefore takes up less area (e.g., silicon area). In the example in FIG. 9, binary-to-thermometer decoding is used for the 4 MSBs of the modulator output to achieve high precision for the 4 MSBs while resistor segmentation is used for the 5 LSBs of the modulator output to reduce the area of the error-feedback DAC 420.

Although FIG. 9 shows an example in which the 4 MSBs of the modulator output are input to the first conversion circuit 910 and the 5 LSBs of the modulator output are input to the second conversion circuit 915, it is to be appreciated that the present disclosure is not limited to this example. In general, the K MSBs of the modulator output may be input to the first conversion circuit 910 and the L LSBs of the modulator output may be input to the second conversion circuit 915, where K and L are integers. In this case, the first conversion circuit 910 may comprise approximately $2^K$ current cells, and the second conversion circuit 915 may comprise approximately L current cells.

The error-feedback DAC 420 according to embodiments of the present disclosure may also be used in envelope tracking. Envelope tracking may involve tracking the envelope of the transmit signal from the error-feedback DAC 420 and dynamically adjusting the supply voltage of the power amplifier based on the tracked envelope to increase power efficiency.

As discussed above, an out-of-band frequency band may correspond to the receive frequency band of a receiver located in the same device (e.g., mobile device) as the transmitter 110. In this example, the noise requirement for the out-of-band frequency band may be established to keep the noise within the receive band of the receiver below a certain level to achieve a desired sensitivity.

Figure 11:
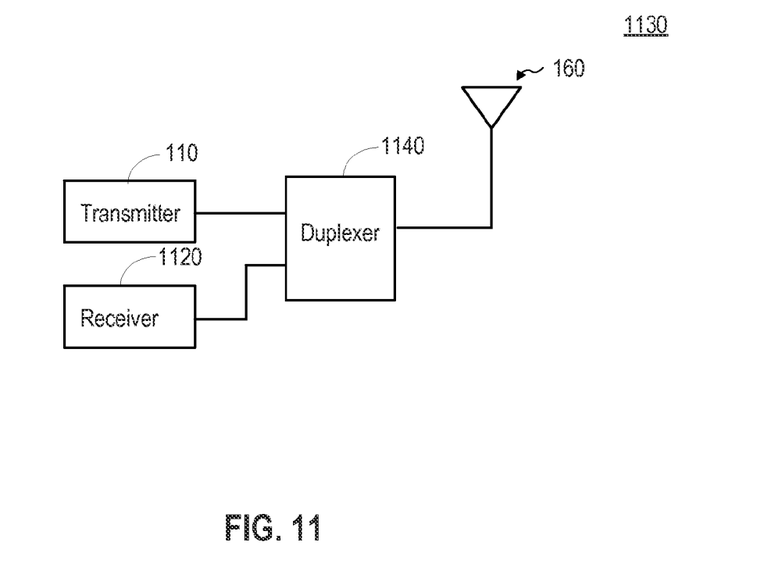
FIG. 11 shows an example of a device comprising a transmitter and a receiver according to an embodiment of the present disclosure.

In this regard, FIG. 11 shows an example of a receiver 1120 located in the same device 1130 (e.g., mobile device) as the transmitter 110. In this example, the device 1130 comprises a duplexer 1140 configured to couple the transmitter 110 and the receiver 1120 to the antenna 160 while isolating the transmitter 110 from the receiver 1120. In other words, the duplexer 1140 is configured to couple a transmit signal from the transmitter 110 to the antenna 160 for wireless transmission while blocking the transmit signal from the receiver 1120. The duplexer 1140 is also configured to couple a signal received by the antenna 160 to the receiver 1120.

In practice, the duplexer 1140 does not provide complete isolation, and a small amount of the transmit signal leaks into the receiver 1120. As a result, noise from the transmit signal that is within the receive band of the receiver 1120 may be coupled into the receiver 1120, reducing the sensitivity of the receiver 1120. If the noise is high enough, the sensitivity of the receiver 1120 may be significantly degraded, resulting in a high bit-error rate. To prevent this, an out-of-band noise requirement for the error-feedback DAC 420 may be establish for an out-of-band frequency band corresponding to the receive band of the receiver 1120. In this case, the filter coefficients of the filter 530 may be adjusted to place a notch within the out-of-band frequency band to reduce noise within the receive band of the receiver 1120.

In another example, an out-of-band frequency band may correspond to the receive frequency band of a receiver in another device (e.g., mobile device) that is located near the device on which the transmitter 110 resides. In this example, the noise requirement for the out-of-band frequency band may be established to keep the noise within the receive band of the receiver below a certain level to achieve a desired sensitivity. The receiver and transmitter may operate according to the same communication standard or different communication standards.

In yet another example, an out-of-band frequency band may correspond to a frequency band of a channel on which another device (e.g., mobile device) receives signals. The other device may be located within the transmit range of the device on which the transmitter 110 resides, and therefore may receive interference from the transmitter 110 on the channel. If the interference is above a certain level, then the interference may jam the other device and/or cause dropped calls at the other device. In this example, the noise requirement for the out-of-band frequency band may be established to prevent noise from the transmitter 110 from causing excessive interference on the channel used by the other device.

In one embodiment, the transmitter 110 may be configured to operate in different transmit modes, in which the out-of-bound frequency bands for each transmit mode may be different. The different transmit modes may correspond to different communication standards. For example, one transmit mode may correspond to an LTE standard, and another transmit mode may correspond to a CDMA standard. In another example, the different transmit modes may correspond to different transmit bands. In this embodiment, the filter coefficients of the feedback filter 530 and/or sampling frequency may be dynamically adjusted depending on which one of the transmit modes the transmitter 110 is currently operating in.

Figure 12:
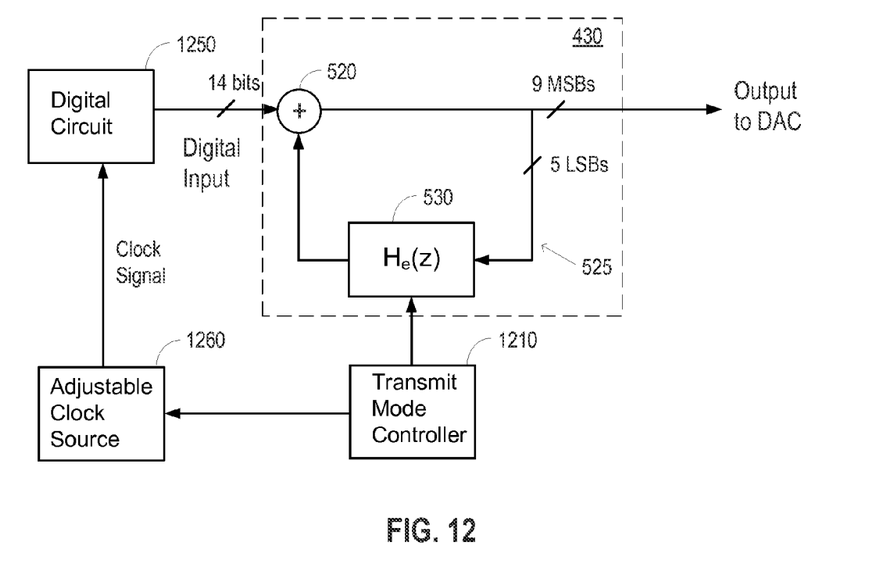
FIG. 12 shows a transmit mode controller according to embodiment of the present disclosure.

In this regard, FIG. 12 shows an example in which the transmitter comprises a transmit mode controller 1210 configured to adjust the filter coefficient of the feedback filter 530 and/or sampling frequency of the input digital signal based on the current transmit mode of the transmitter. In one example, the transmit mode controller 120 may store a set of filter coefficient values for each one of the different transmit modes in a memory. The set of filter coefficient values for each transmit mode may place notches at frequencies within the out-of-band frequency bands for the transmit mode. When the transmitter is to operate in one of the transmit modes, the transmit mode controller 1210 may receive a signal indicating the selected transmit mode. The transmit mode controller 1210 may then retrieve the filter coefficient values for the selected transmit mode from memory and program the filter coefficient values into the feedback filter 530.

In another example, the transmit controller 120 may store a sampling frequency value for each one of the different transmit modes in the memory. The sampling frequency for each transmit mode may place notches at frequencies within the out-of-band frequency bands for the transmit mode. When the transmitter is to operate in one of the transmit modes, the transmit mode controller 1210 may receive a signal indicating the selected transmit mode. The transmit mode controller 1210 may then retrieve the sampling frequency value for the selected transmit mode from memory and set the sampling frequency of the digital signal input to the modulator 430 accordingly. In this example, the digital circuit (e.g., DSP) 1250 that outputs the digital signal to the modulator 430 may clock the digital signal according to a clock signal input to the digital circuit from an adjustable clock source (e.g., PLL) 1260, and the transmit mode controller 1210 may adjust the sampling frequency by adjusting the clock frequency of the clock source accordingly.

Figure 13:
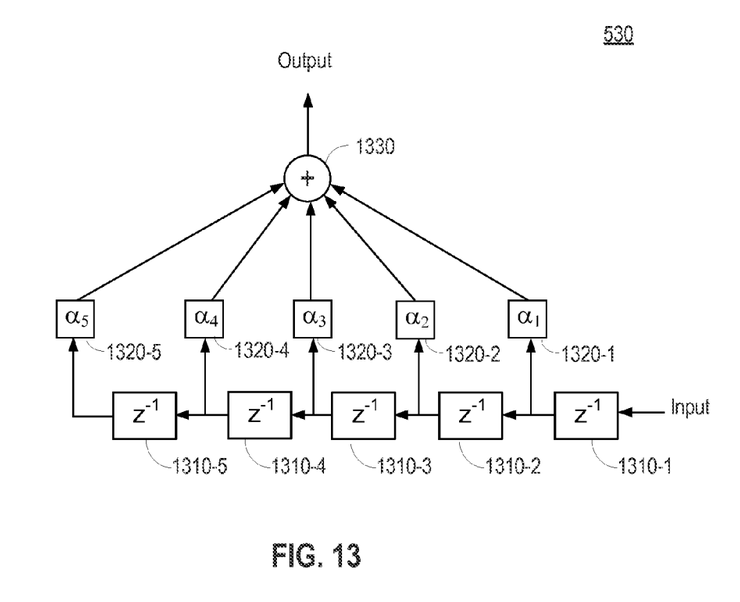
FIG. 13 shows an exemplary implementation of a feedback filter according to an embodiment of the present disclosure.

FIG. 13 shows an exemplary implementation of the feedback filter 530 according to an embodiment of the present disclosure. In this example, the filter comprises a plurality of delay elements 1310-1 to 1310-5, a plurality of multipliers 1320-1 to 1320-5, and an adder 1330.

The delay elements 1310-1 to 1310-5 are coupled in series, forming a delay line. As a result, the output of each delay element 1310-1 to 1310-5 corresponds to a different amount of delay of the signal input to the filter. For example, the output of delay element 1310-1 corresponds to a delay of $z^{-1}$ in the Z domain (one sample period) and the output of delay element 1310-5 corresponds to a delay of $z^{-5}$ in the Z domain.

Each of the multipliers 1320-1 to 1320-5 is coupled to the output of a different delay element 1310-1 to 1310-5 in the delay line. Each multiplier multiplies the output of the respective delay element by a respective filter coefficient. The adder 1330 sums the outputs of the multipliers 1320-1 to 1320-5 to generate the output of the filter 530. The exemplary implementation of the filter 530 shown in FIG. 13 may be used to implement the filter function in equation (1).

Figure 14:
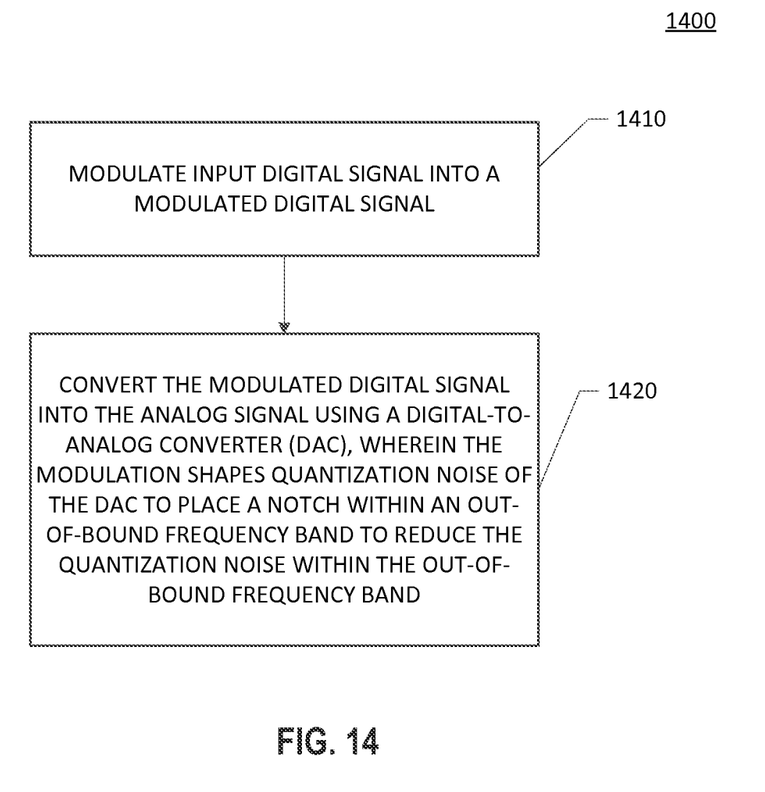
FIG. 14 is a flowchart of a method for converting a digital signal into an analog signal according to an embodiment of the present disclosure.

FIG. 14 is a flowchart illustrating a method 1400 for converting an input digital signal into an analog signal. The method may be performed by the error-feedback DAC 420.

In step 1410, the input digital signal is modulated into a modulated digital signal. For example, the input digital signal may be modulated using an error-feedback modulator (e.g., modulator 430).

In step 1420, the modulated digital signal is converted into the analog signal using a digital-to-analog converter (DAC). For example, the modulated digital signal may be converting using DAC 440. In this example, the modulated digital signal may be split into K MSBs and L LSBs, in which the K MSBs may be converted into a first analog current using binary-to-thermometer decoding, and the L LSBs may be converted into a second analog current using resistor segmentation (e.g., R-2R segmentation). The first and second analog signals may then be combined to obtain the analog signal.

The modulation shapes the quantization noise of the DAC to place a notch at a frequency within an out-of-bound frequency band to reduce the quantization noise within the out-of-bound frequency band. In one example, the out-of-band frequency band corresponds to a receive frequency band of a receiver. In another example, the out-of-band frequency band corresponds to a frequency band of a channel on which a mobile device receives signals.

The feedback modulator 430 and transmit mode controller 1210 according to embodiments of the present disclosure may be implemented with a general-purpose processor, a digital signal processor (DSP), an application specific integrated circuit (ASIC), a field programmable gate array (FPGA) or other programmable logic device, discrete hardware components, or any combination thereof designed to perform the functions described herein. A general-purpose processor may be a microprocessor, but in the alternative, the processor may be any conventional processor, controller, microcontroller, or state machine. A processor may perform the functions described herein by executing software comprising code for performing the functions. The software may be stored on a computer-readable storage medium, such as a RAM, a ROM, an EEPROM, an optical disk, and/or a magnetic disk.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure.

Thus, the disclosure is not intended to be limited to the examples described herein but is to be accorded the widest scope consistent with the principles and novel features disclosed herein.

What is claimed is:

1. A circuit, comprising:
   a transmit mode controller configured to adjust a sampling frequency of an input digital signal;
   an error-feedback modulator configured to receive the input digital signal, and to modulate the digital input signal into a modulated digital signal; and
   a digital-to-analog converter (DAC) configured to convert the modulated digital signal into an analog signal;
   wherein the error-feedback modulator is configured to modulate the input digital signal to shape quantization noise of the DAC to produce a notch, and the transmit mode controller is configured to adjust the sampling frequency of the input signal to place the notch at a frequency within an out-of-bound frequency band to reduce the quantization noise within the out-of-bound frequency band.

2. The circuit of claim 1, further comprising a low-pass filter configured to low-pass filter the analog signal.

3. The circuit of claim 2, wherein the low-pass filter is a first-order low-pass filter, a second-order low-pass filter, or a third order low-pass filter.

4. The circuit of claim 1, wherein the out-of-band frequency band corresponds to a receive frequency band of a receiver.

5. The circuit of claim 4, wherein the receiver is located on a same mobile device as the circuit.

6. The circuit of claim 1, wherein the out-of-band frequency band corresponds to a frequency band of a channel on which a mobile device receives signals.

7. The circuit of 1, wherein the error-feedback modulator comprises:
   an adder; and
   a feedback filter;
   wherein the adder is configured to add an output signal of the feedback filter to the input digital signal, and M most significant bits (MSBs) of an output signal of the adder provide the modulated digital signal of the modulator;
   wherein the feedback filter is configured to filter N least significant bits (LSBs) of the output signal of the adder to generate the output signal of the feedback filter.

8. The circuit of claim 1, wherein the DAC comprises:
   a first conversion circuit configured to convert K most significant bits (MSBs) of the modulated digital signal into a first analog current; and
   a second conversion circuit configured to convert L least significant bits (LSBs) of the modulated digital signal into a second analog current;
   wherein the first and second analog currents are combined to obtain the analog signal.

9. The circuit of claim 8, wherein the first conversion circuit comprises:
   a binary-to-thermometer decoder configured to decode the K MSBs of the modulated digital signal into one of a plurality of current levels; and
   a first plurality of current cells, wherein each of the first plurality of current cells is configured to be selectively enabled by the decoder, and each of the first plurality of current cells is configured to contribute a current to the first analog current when enabled by the decoder;

wherein the decoder is configured to enable a number of the first plurality of current cells based on the one of the plurality of current levels.

10. The circuit of claim 9, wherein the second conversion circuit comprises:
a segmented resistor circuit; and
a second plurality of current cells, wherein each of the second plurality of current cells is configured to selectively output a current to a different node on the segmented resistor circuit depending on a value of a respective one of the L LSBs of the modulated digital signal, and the segmented resistor is configured to passively split the current at each node.

11. The circuit of claim 10, wherein each of the first and second plurality of current cells outputs approximately a same amount of current.

12. The circuit of claim 1, wherein a number of bits of the modulated digital signal is less than a number of bits of the input digital signal.

13. The circuit of claim 1, wherein the error-feedback modulator comprises a feedback filter, and the transmit mode controller is configured to adjust filter coefficients of the feedback filter based on a selected one of a plurality of transmit modes.

14. The circuit of claim 13, wherein each of the transmit modes corresponds to a different transmit band.

15. A method for converting an input digital signal into an analog signal, comprising:
adjusting a sampling frequency of the input digital signal;
modulating the input digital signal into a modulated digital signal; and
converting the modulated digital signal into the analog signal using a digital-to-analog converter (DAC);
wherein the modulating shapes quantization noise of the DAC to produce a notch, and adjusting the sampling frequency of the input digital signal comprises adjusting the sampling frequency of the input digital signal to place the notch at a frequency within an out-of-bound frequency band to reduce the quantization noise within the out-of-bound frequency band.

16. The method of claim 15, further comprising low-pass filtering the analog signal.

17. The method of claim 16, wherein low-pass filtering the analog signal comprises low-passing the analog signal using a first-order low-pass filter, a second-order low-pass filter, or a third order low-pass filter.

18. The method of claim 15, wherein the out-of-band frequency band corresponds to a receive frequency band of a receiver.

19. The method of claim 15, wherein the out-of-band frequency band corresponds to a frequency band of a channel on which a mobile device receives signals.

20. The method of claim 15, wherein converting the modulated digital signal into the analog signal comprises:
converting K most significant bits (MSBs) of the modulated digital signal into a first analog current;
converting L least significant bits (LSBs) of the modulated digital signal into a second analog current; and
combining the first and second analog currents to obtain the analog signal.

21. The method of claim 20, wherein converting the K MSBs of the modulated digital signal into the first analog signal comprises:
decoding the K MSBs of the modulated digital signal into one of a plurality of current levels using a binary-to-thermometer decoder; and
adjusting a current level of the first analog current based on the one of the plurality of current levels.

22. The method of claim 21, wherein converting the L LSBs of the modulated digital signal into the second analog signal comprises:
outputting a plurality of currents to different nodes of a segmented resistor circuit based on values of the L LSBs of the modulated digital signal; and
obtaining the second analog signal from an output node of the segmented resistor circuit.

23. The method of claim 15, wherein modulating the input digital signal into the modulated digital signal is performed using a feedback filter, and the method further comprises adjusting filter coefficients of the feedback filter.

24. An apparatus for converting an input digital signal into an analog signal, comprising:
means for adjusting a sampling frequency of the input digital signal;
means for modulating the input digital signal into a modulated digital signal; and
means for converting the modulated digital signal into the analog signal;
wherein the modulating shapes quantization noise of the DAC to produce a notch, and the means for adjusting the sampling frequency of the input digital signal comprises means for adjusting the sampling frequency of the input digital signal to place the notch at a frequency within an out-of-bound frequency band to reduce the quantization noise within the out-of-bound frequency band.

25. The apparatus of claim 24, further comprising means for low-pass filtering the analog signal.

26. The apparatus of claim 24, wherein the out-of-band frequency band corresponds to a receive frequency band of a receiver.

27. The apparatus of claim 24, wherein the out-of-band frequency band corresponds to a frequency band of a channel on which a mobile device receives signals.

28. The apparatus of claim 24, wherein the means for converting the modulated digital signal into the analog signal comprises:
means for converting K most significant bits (MSBs) of the modulated digital signal into a first analog current;
means for converting L least significant bits (LSBs) of the modulated digital signal into a second analog current; and
means for combining the first and second analog currents to obtain the analog signal.

29. The apparatus of claim 28, wherein the means for converting the K MSBs of the modulated digital signal into the first analog signal comprises:
means for decoding the K MSBs of the modulated digital signal into one of a plurality of current levels; and
means for adjusting a current level of the first analog current based on the one of the plurality of current levels.

30. The apparatus of claim 29, wherein the means for converting the L LSBs of the modulated digital signal into the second analog signal comprises:
means for outputting a plurality of currents to different nodes of a segmented resistor circuit based on values of the L LSBs of the modulated digital signal; and
means for obtaining the second analog signal from an output node of the segmented resistor circuit.

31. The apparatus of claim 24, further comprising means for adjusting filter coefficients of the means for modulating the input digital signal.

\* \* \* \* \*